(12) United States Patent
Lu et al.

(10) Patent No.: US 10,993,348 B2
(45) Date of Patent: Apr. 27, 2021

(54) SERVER CHASSIS

(71) Applicant: GIGA-BYTE TECHNOLOGY CO., LTD., New Taipei (TW)

(72) Inventors: Chia-Chen Lu, New Taipei (TW); Ching-Chuan Huang, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/847,690

(22) Filed: Apr. 14, 2020

(65) Prior Publication Data
US 2020/0383228 A1 Dec. 3, 2020

(30) Foreign Application Priority Data
May 27, 2019 (TW) ................................ 10811817.0

(51) Int. Cl.
*H05K 7/14* (2006.01)
*G11B 33/12* (2006.01)

(52) U.S. Cl.
CPC ......... *H05K 7/1489* (2013.01); *G11B 33/124* (2013.01); *G11B 33/128* (2013.01)

(58) Field of Classification Search
CPC ............................. H05K 7/1489; G11B 33/128
See application file for complete search history.

(56) References Cited

U.S. PATENT DOCUMENTS

| 10,212,840 | B2* | 2/2019 | Kuan | H05K 7/1487 |
| 2004/0125556 | A1* | 7/2004 | Chen | G11B 33/128 |
| | | | | 361/679.39 |
| 2008/0019036 | A1* | 1/2008 | Chu | G11B 33/128 |
| | | | | 360/99.13 |
| 2015/0192970 | A1* | 7/2015 | Jau | G11B 33/128 |
| | | | | 361/679.33 |
| 2020/0396859 | A1* | 12/2020 | Liu | H05K 7/1489 |
| 2021/0045261 | A1* | 2/2021 | Huang | H05K 7/1489 |

FOREIGN PATENT DOCUMENTS

| TW | M248200 | 10/2004 |
| TW | I244365 | 11/2005 |
| TW | I501717 | 9/2015 |
| TW | I607301 | 12/2017 |

* cited by examiner

Primary Examiner — Daniel J Rohrhoff
(74) Attorney, Agent, or Firm — JCIPRNET

(57) ABSTRACT

A server chassis including a main casing, a support, a hard disk bracket and a retractable engaging member is provided. The main casing includes a lateral plate. The support is fixed to the lateral plate and has an assembling channel and an engaging slot at an end of the assembling channel. The hard disk bracket is detachably disposed at the support and has a first surface towards the support. The retractable engaging member is disposed at the hard disk bracket and has a first base, an engaging portion movably disposed at the first base, a button linked to the engaging portion and a first elastic member located between the button and the engaging portion. The engaging portion is retractably protruded from the first surface of the hard disk bracket and adapted to move in or out of the engaging slot along an edge of the assembling channel of the support.

10 Claims, 17 Drawing Sheets

SERVER CHASSIS

CROSS-REFERENCE TO RELATED APPLICATION

This application claims the priority benefit of Taiwan application serial no. 108118170, filed on May 27, 2019. The entirety of the above-mentioned patent application is hereby incorporated by reference herein and made a part of this specification.

BACKGROUND

Technical Field

The disclosure relates to a chassis, and particularly relates to a server chassis.

Description of Related Art

With the growing demand for data storage, a design for expanding hard disks of a server becomes more and more important. How to quickly disassemble and assemble an expanded hard disk bracket without using tools is a trend of current design.

SUMMARY

The invention provides a server chassis, in which a hard disk bracket is detachably fixed on a support through a retractable engaging member, so as to facilitate quick disassembly and assembly by a user without using tools.

The invention provides a server chassis including a main casing, a support, a hard disk bracket and a retractable engaging member. The main casing includes a lateral plate. The support is fixed to the lateral plate, and the support has an assembling channel recessed from an edge and an engaging slot located at an end of the assembling channel. The hard disk bracket is detachably disposed on the support. The hard disk bracket has a first surface facing the support. The retractable engaging member penetrates through the hard disk bracket and has a first base, an engaging portion movably penetrating through the first base, a button linked to the engaging portion and a first elastic member located between the button and the engaging portion, where the button and the engaging portion are protruded from two opposite ends of the first base, the engaging portion is retractably protruded from the first surface of the hard disk bracket, and the engaging portion of the retractable engaging member is adapted to move in or out of the engaging slot along an edge of the assembling channel of the support.

In an embodiment of the invention, when the hard disk bracket is disposed on the support, the hard disk bracket is pivotally connected to the support by taking the retractable engaging member as an axis.

In an embodiment of the invention, one of the hard disk bracket and the support includes a protruding assembly, and the other one includes a recessed assembly corresponding to the protruding assembly, the recessed assembly is located at an end point of a movement trajectory of the protruding assembly, and during rotation of the hard disk bracket relative to the support, the protruding assembly is adapted to push against the hard disk bracket or the support having the recessed assembly until the protruding assembly is aligned with the recessed assembly.

In an embodiment of the invention, the recessed assembly is located on the hard disk bracket, the support has a second surface facing the first surface, and the protruding assembly is located on the support and is protruded from the second surface, the protruding assembly includes a plurality of protrusions protruding from the second surface, and the recessed assembly includes a plurality of positioning recess holes located on the hard disk bracket. When the hard disk bracket is located at an initial position relative to the support, the protrusions are located beside an edge of the hard disk bracket without contacting the hard disk bracket. During rotation of the hard disk bracket relative to the support, one of the protrusions first contacts the first surface of the hard disk bracket. After the hard disk bracket is rotated relative to the support by a specific angle, the protrusions together contact the first surface of the hard disk bracket.

In an embodiment of the invention, each of the protrusions includes a second base disposed on the support and a bead disposed on the second base, and the bead is protruded from the second surface.

In an embodiment of the invention, each of the protrusions includes an embossing portion of the support.

In an embodiment of the invention, the support includes a stop member located beside the assembling channel, and the hard disk bracket is rotated relative to the support until the hard disk bracket contacts the stop member.

In an embodiment of the invention, the main casing includes a bottom plate connected to the lateral plate and a first partition plate standing on an edge of the bottom plate, the first partition plate has a first hole, the hard disk bracket includes a first extending portion extending downward, and the first extending portion has a second hole. When the hard disk bracket is disposed on the support, the second hole is aligned with the first hole. The server chassis further includes a bolt penetrating through the second hole and the first hole.

In an embodiment of the invention, the main casing includes a bottom plate connected to the lateral plate and a second partition plate standing on an edge of the bottom plate, the second partition plate has a screw hole, the hard disk bracket includes a second extending portion extending downward, and the second extending portion has a third hole. When the hard disk bracket is disposed on the support, the third hole is aligned with the screw hole. The server chassis further includes a screw penetrating through the third hole and fixed to the screw hole.

In an embodiment of the invention, the support has a position limiting groove recessed from the edge, the hard disk bracket includes a positioning bolt protruding from the first surface, and the positioning bolt includes a neck portion connected to the first surface and an expansion portion connected to the neck portion. The neck portion is adapted to enter the position limiting groove of the support, and a width of the expansion portion is larger than a width of the position limiting groove.

Based on the above description, the retractable engaging member is disposed on the hard disk bracket of the server chassis of the invention. When a user wants to assemble the hard disk bracket to the support, as long as the engaging portion of the retractable engaging member is put into the engaging slot along the edge of the assembling channel of the support, the engaging portion is pulled by the first elastic member to lean against the engaging slot to complete the assembly. When the user wants to remove the hard disk bracket from the support, the user may press the button of the retractable engaging member, so that the engaging portion of the retractable engaging member does not lean against the engaging slot of the support, and then the hard disk bracket may be pulled up to make the retractable engaging member leave the support along the assembling channel, so as to complete the disassembly.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
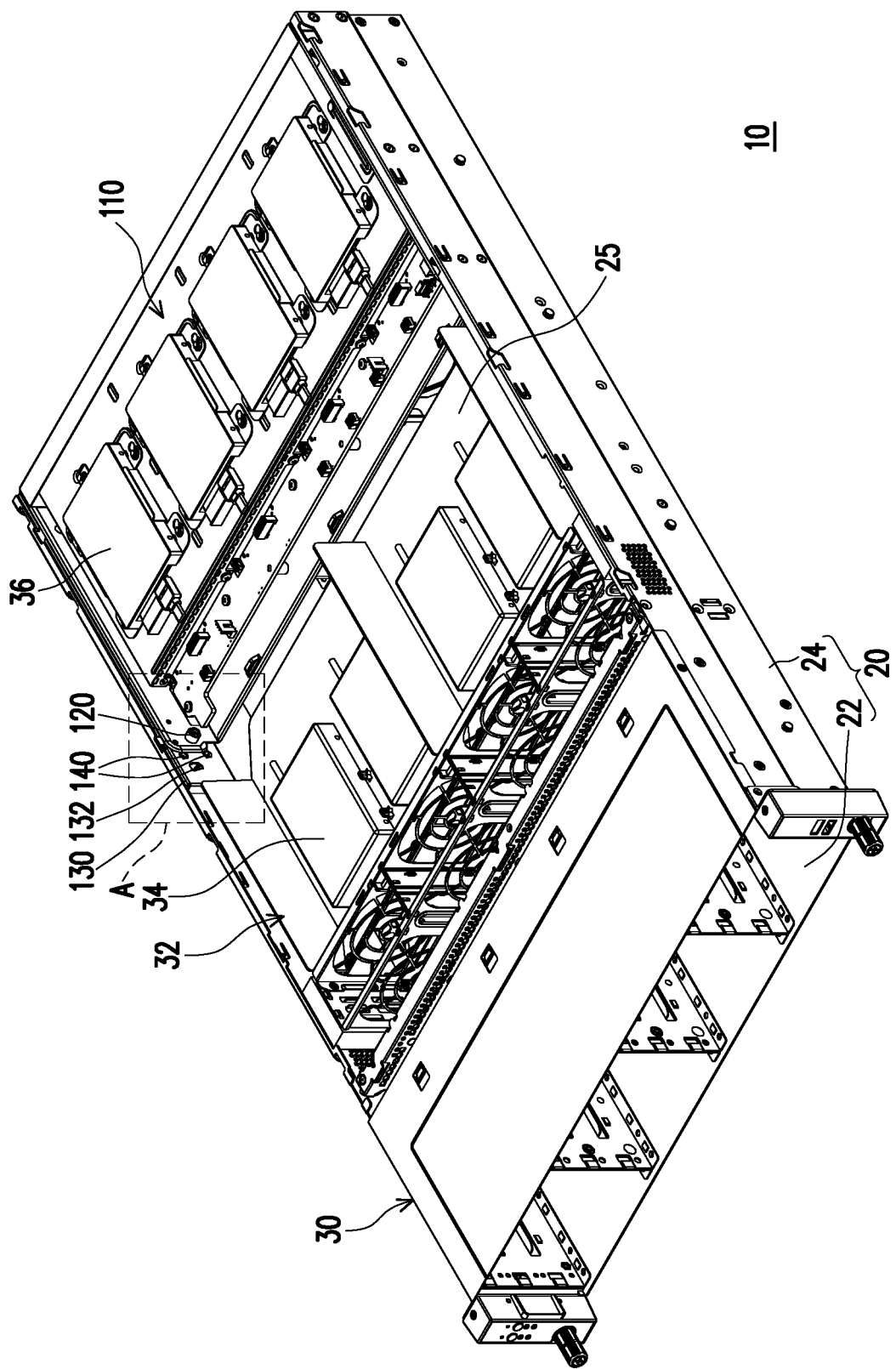
FIG. 1A is a schematic diagram of a server chassis according to an embodiment of the invention.
Figure 1B:
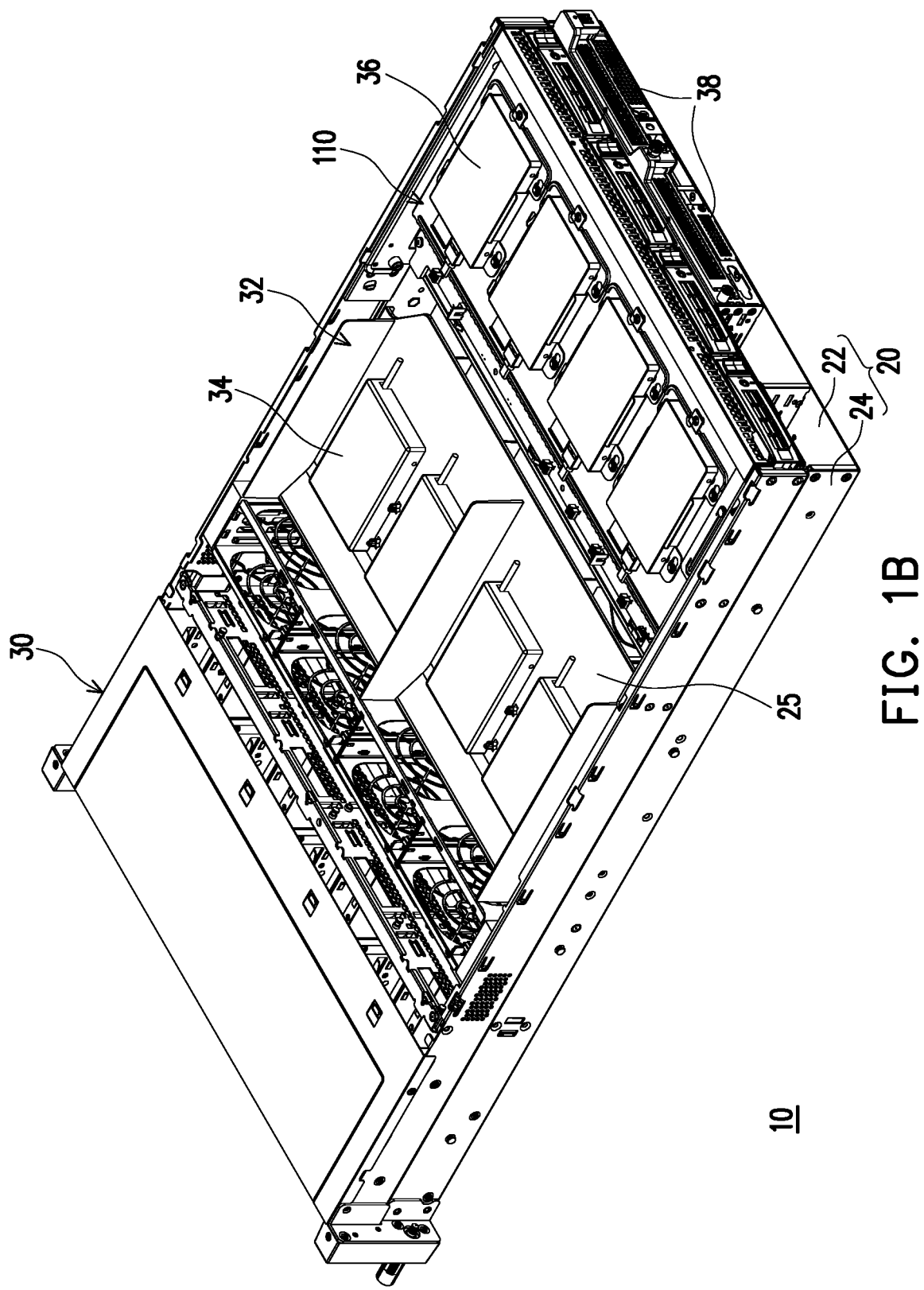
FIG. 1B is a schematic diagram of the server chassis of FIG. 1A in another viewing angle.

FIG. 1A is a schematic diagram of a server chassis according to an embodiment of the invention. FIG. 1B is a schematic diagram of the server chassis of FIG. 1A in another viewing angle. Referring to FIG. 1A and FIG. 1B, the server chassis 10 of the embodiment includes a main casing 20, and in FIG. 1A, the server chassis 10 includes a first hard disk region 30, a second hard disk region 32 and a hard disk bracket 110. The first hard disk region 30 is a region of a general server chassis used for placing hard disks, and as a demand for the hard disks increases, in some server chassis, an additional space is planned for configuring the hard disks, and in the embodiment, in addition to the first hard disk region 30, the second hard disk region 32 and the hard disk bracket 110 are further planned.

In the embodiment, the server chassis 10 is, for example, a server chassis with a height of 2 U, and a motherboard (not shown) and an air director 25 located on the motherboard may be arranged below the second hard disk region 32, and the second hard disk region 32 is configured with a plurality of hard disks 34. Certainly, in other embodiments, other plans may also be made at the position of the second hard disk region 32 in the server chassis 10.

Moreover, as shown in FIG. 1A, in the embodiment, the hard disk bracket 110 is detachably disposed on top of an expansion card 38, and the hard disk bracket 110 is configured with a plurality of hard disks 36 to provide further expansion. In the embodiment, a user may choose to install 2.5-inch or 3.5-inch hard disks on the first hard disk region 30 (no hard disk is shown), the second hard disk region 32 and the hard disk bracket 110. Namely, the hard disks 34 and 36 may be 2.5-inch or 3.5-inch hard disks, and the form and size of the hard disks are not limited by the drawings.

Figure 2A:
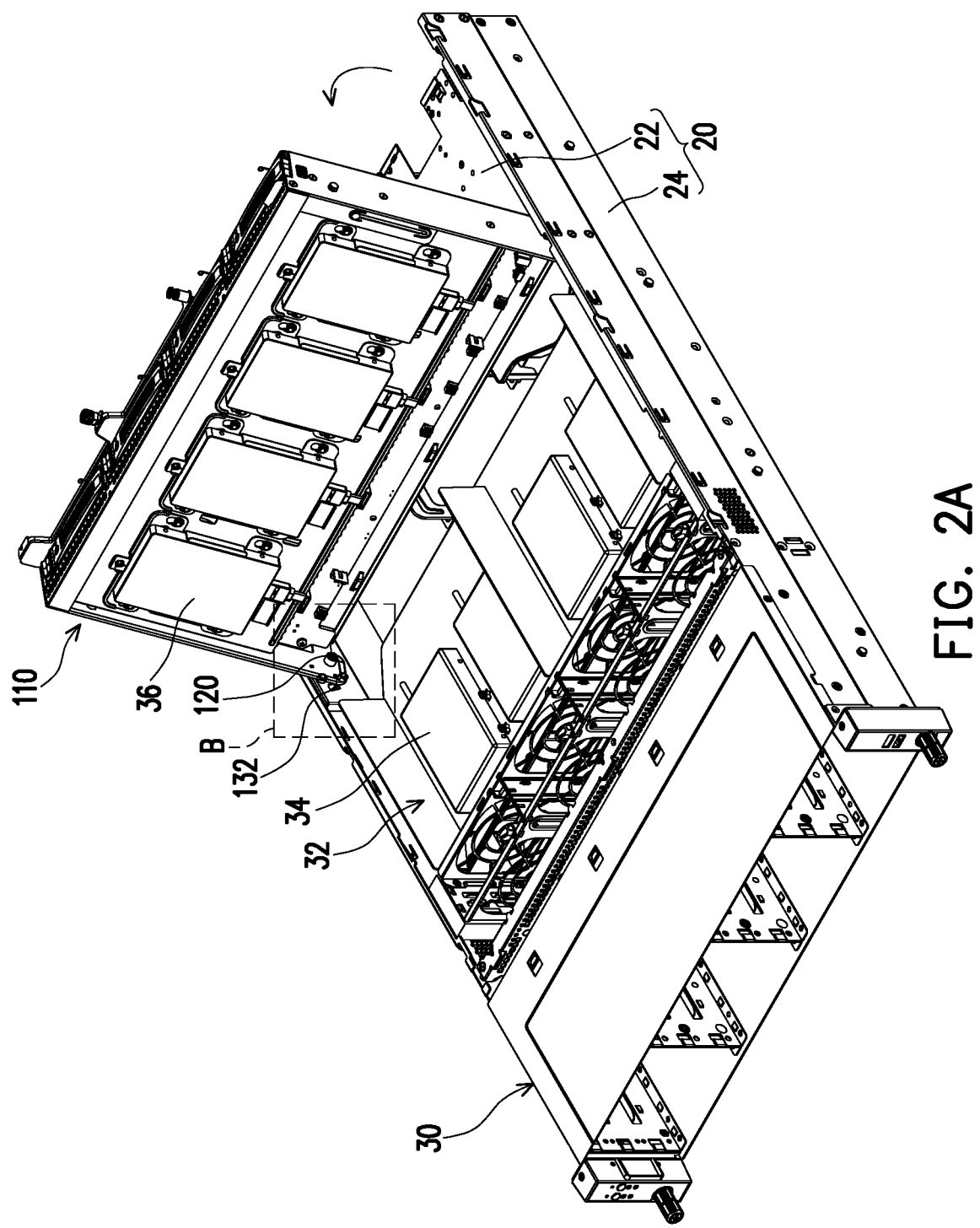
FIG. 2A to FIG. 2B are schematic diagrams of a process of flipping a hard disk bracket of the server chassis of FIG. 1B.
Figure 2B:
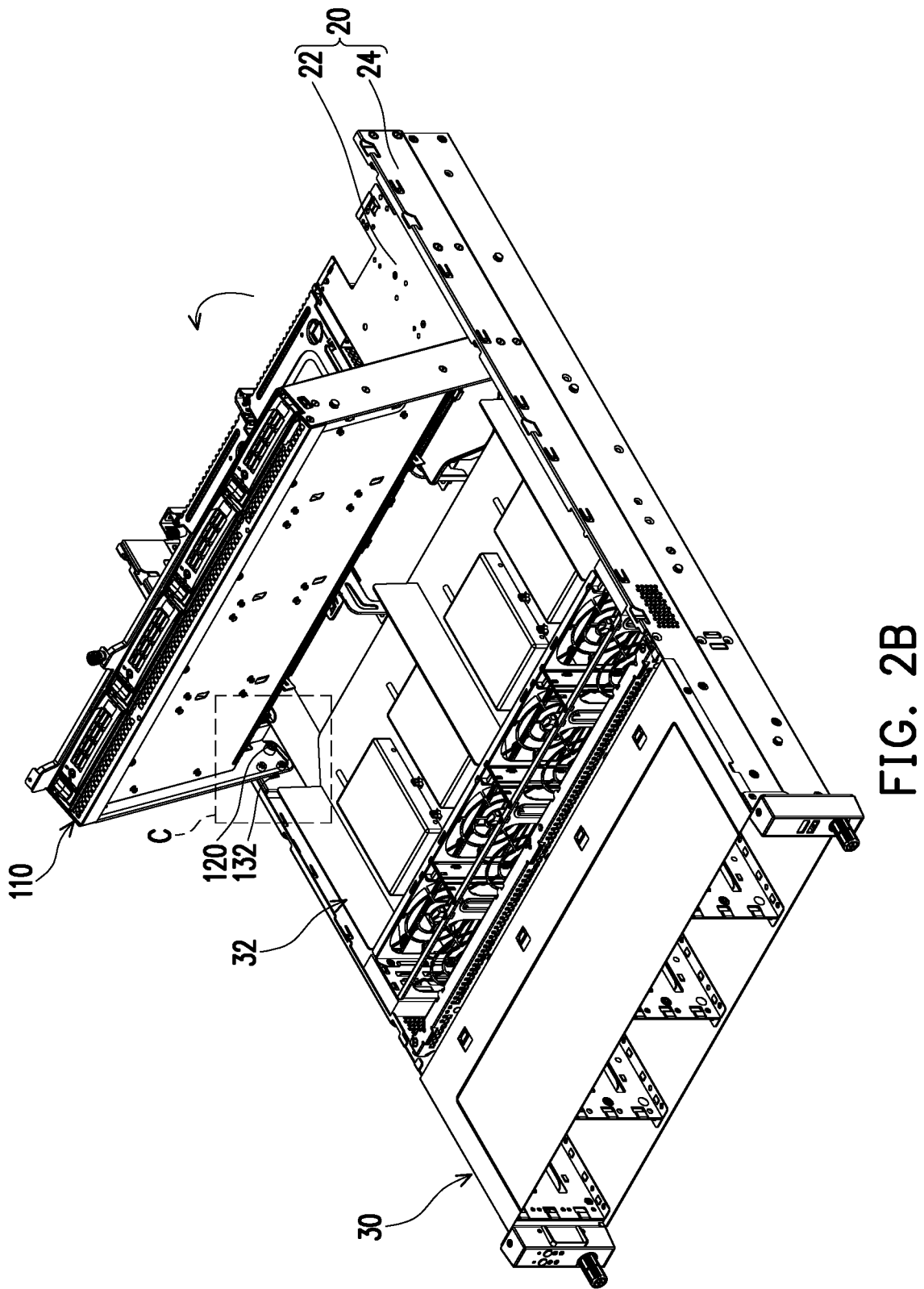

FIG. 2A to FIG. 2B are schematic diagrams of a process of flipping the hard disk bracket of the server chassis of FIG. 1B. Referring to FIG. 1A, FIG. 2A and FIG. 2B, in the embodiment, the hard disk bracket 110 may be flipped relative to the main casing 20 to facilitate user's maintenance of electronic components (such as the expansion card 38, but the invention is not limited thereto) configured under the hard disk bracket 110. Moreover, in the embodiment, the hard disk bracket 110 may be easily disassembled from/assembled to the main casing 20 without using tools, which will be explained below.

Figure 3A:
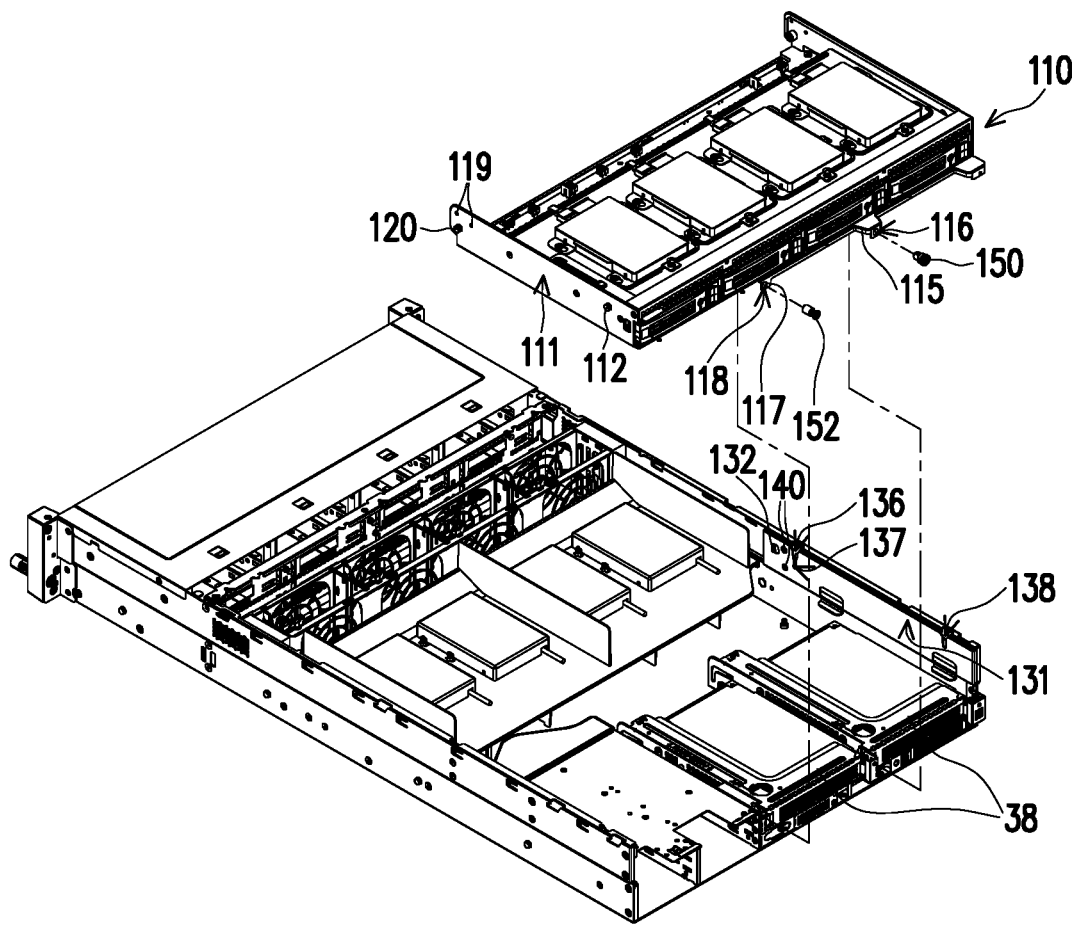
FIG. 3A is a schematic diagram of the server chassis of FIG. 1A with an up-moved hard disk bracket.
Figure 3B:
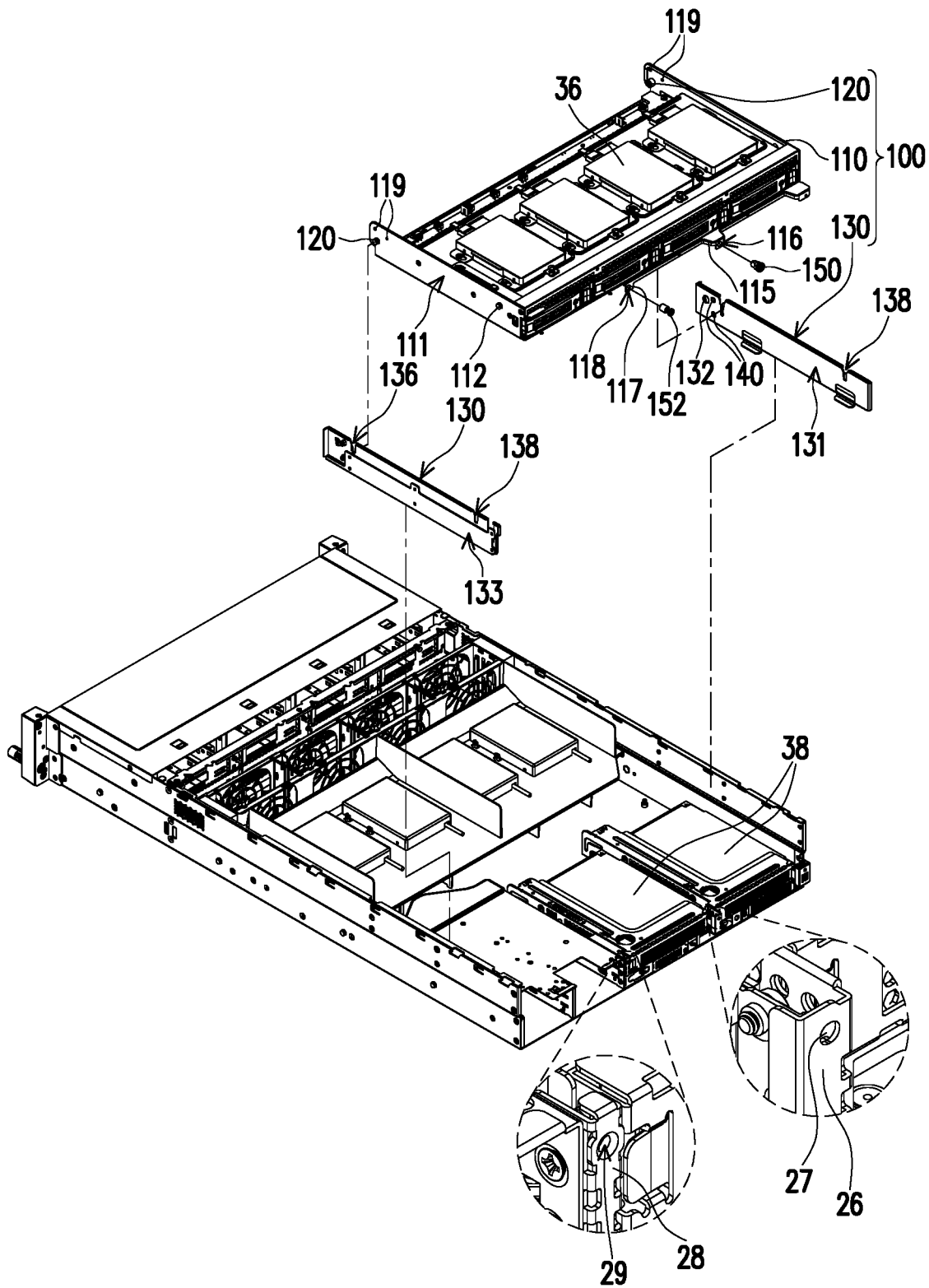
FIG. 3B is a schematic diagram of up-moved supports of FIG. 3A.
Figure 4:
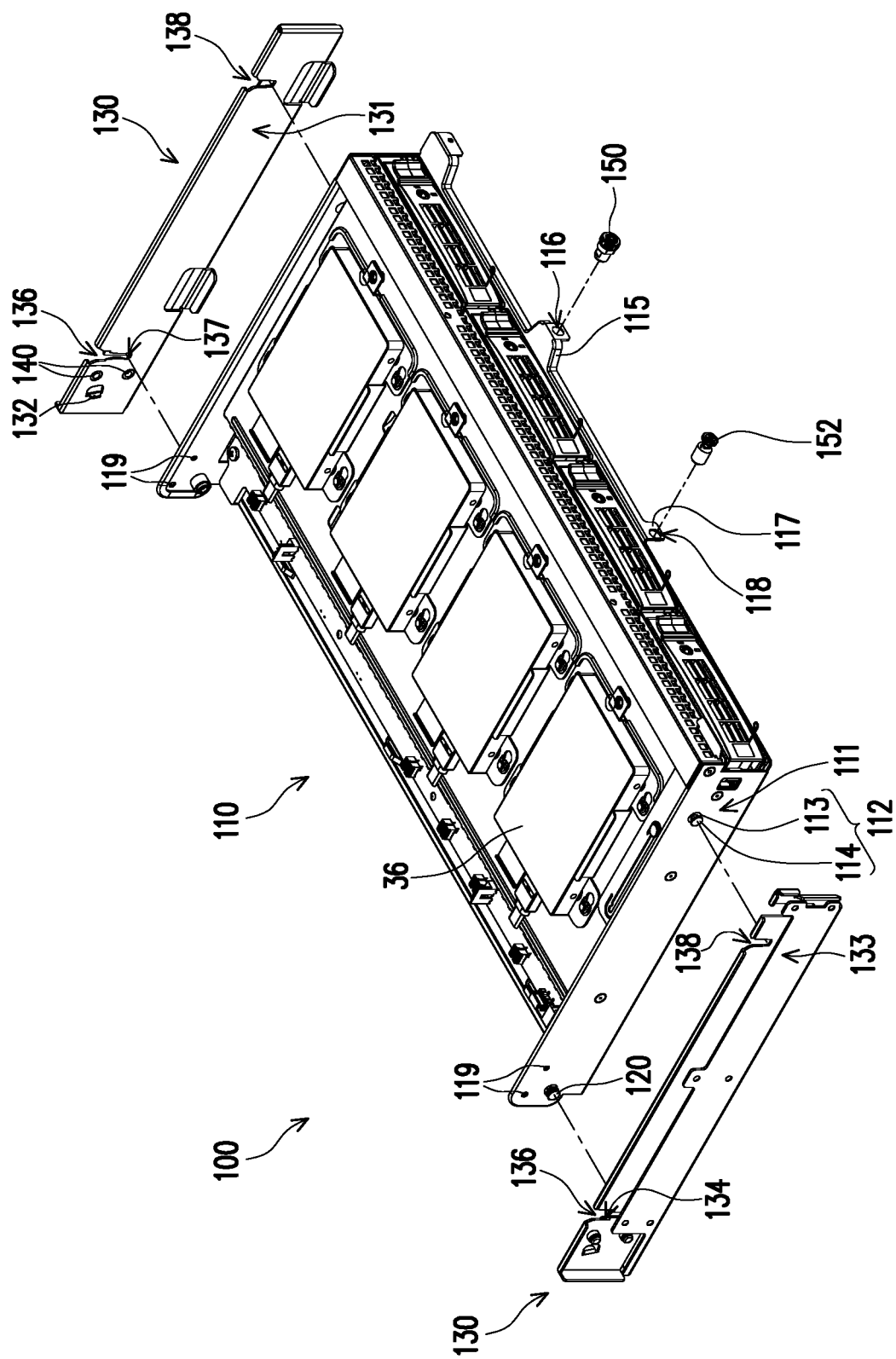
FIG. 4 is an exploded schematic view of supports and a hard disk bracket of the server chassis of FIG. 1A.

FIG. 3A is a schematic diagram of the server chassis of FIG. 1A with an up-moved hard disk bracket. FIG. 3B is a schematic diagram of up-moved supports of FIG. 3A. FIG. 4 is an exploded schematic view of the supports and the hard disk bracket of the server chassis of FIG. 1A. Referring to FIG. 3A to FIG. 4, in the embodiment, the server chassis 10 includes the main casing 20, two supports 130, the hard disk bracket 110 and two retractable engaging members 120. It should be noted that although in this embodiment, an amount of the supports 130 or the retractable engaging members 120 is two, in other embodiments, the amount of the supports 130 or the retractable engaging members 120 may also be one or more, which is not limited by the invention.

The main casing 20 includes a bottom plate 22, two lateral plates 24 connected to the bottom plate 22 and located opposite to each other. The two supports 130 are respectively fixed to the two lateral plates 24. The supports 130 are, for example, fixed to the lateral plates 24 in a locking manner, but the invention is not limited thereto. As shown in FIG. 4, in the embodiment, the hard disk bracket 110 and the supports 130 serve as a quick release device 100, and the hard disk bracket 110 may be quickly disassembled from/assembled to the supports 130 fixed to the lateral plates 24 (FIG. 3B) of the main casing 20 without using tools.

In the embodiment, the hard disk bracket 110 has two first surfaces 111 (i.e. left and right side surfaces of the hard disk bracket 110) facing the supports 130. The retractable engaging member 120 may penetrate through the hard disk bracket 110. Each of the supporters 130 has an assembling channel 136 recessed from an edge and an engaging slot 137 (FIG. 4) located at an end of the assembling channel 136.

Figure 5A:
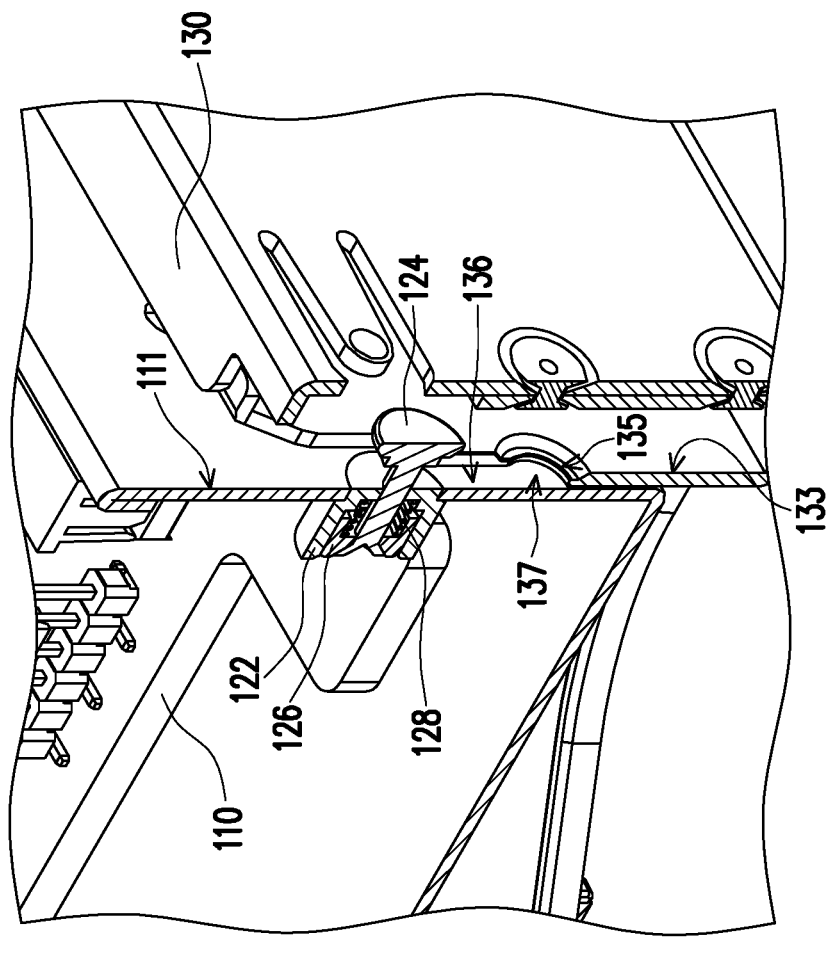
FIG. 5A to FIG. 5C are partial cross-sectional views of a retractable engaging member of FIG. 4 entering an engaging slot along an assembling channel of a support.
Figure 5B:
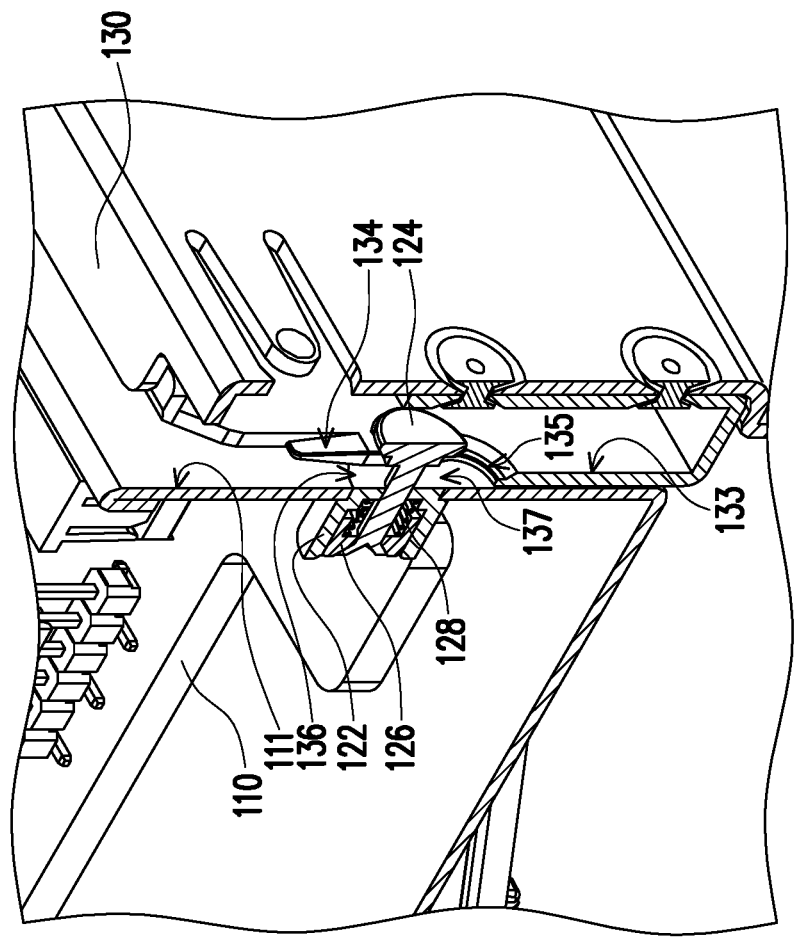
Figure 5C:
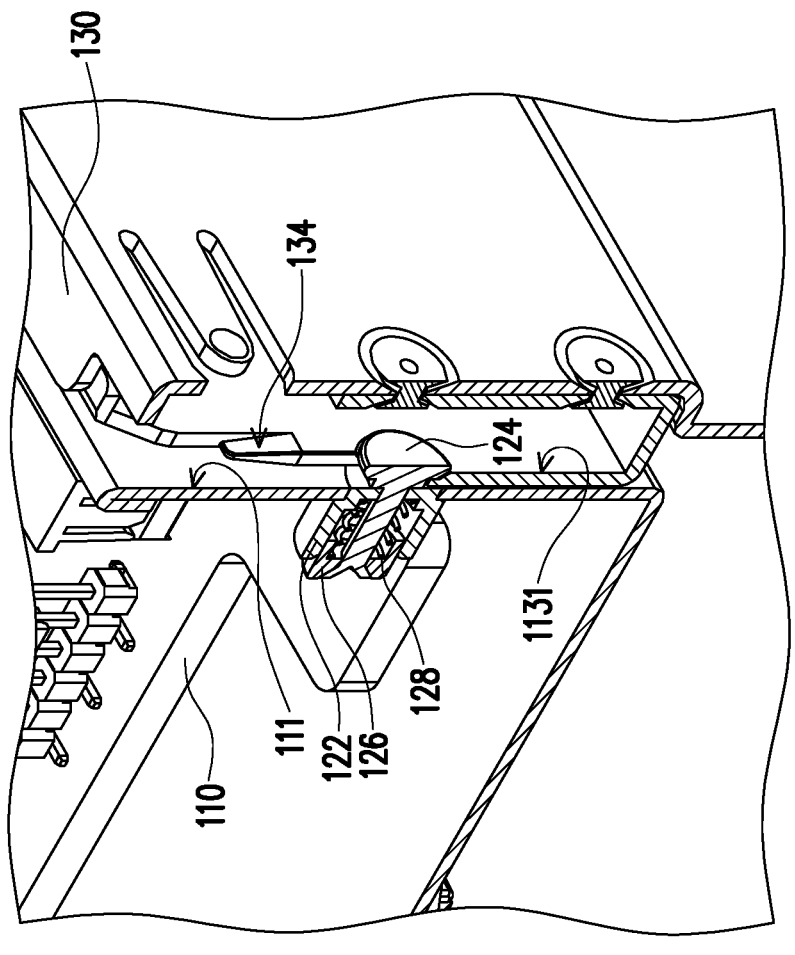
Figure 5C:
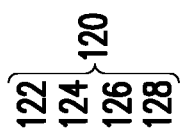

FIG. 5A to FIG. 5C are partial cross-sectional views of the retractable engaging member of FIG. 4 entering the engaging slot along the assembling channel of the support. As shown in FIG. 5A, in the embodiment, the retractable engaging member 120 includes a first base 122, an engaging portion 124 movably penetrating through the first base 122, a button 126 linked to the engaging portion 124 and a first elastic member 128 located between the button 126 and the engaging portion 124. The button 126 and the engaging portion 124 are protruded from two opposite ends of the first base 122, the engaging portion 124 is retractably protruded from the first surface 111 of the hard disk bracket 110. The engaging portion 124 of the retractable engaging member 120 is adapted to move in or out of the engaging slot 137 along the edge of the assembling channel 136 of the support 130. The first elastic member 128 is, for example, a spring, but the first elastic member 128 may also be an elastic piece, a compressed foam, etc., which is not limited by the invention.

In detail, as shown in FIG. 3B, the support 130 has a second surface 131 and a third surface 133 opposite to each other, the second surface 131 faces the first surface 111 of the hard disk bracket 110. The third surface 133 is away from the first surface 111 of the hard disk bracket 110 and faces the lateral plate 24 of the main casing 20.

As shown in FIG. 5A, the third surface 133 presents an inclined surface 134 (FIG. 5B) at a position near the assembling channel 136. During a process that the engaging portion 124 passes through the assembling channel 136, the engaging portion 124 moves along the inclined surface 134 in a direction further protruding from the first surface 111, so that the first elastic member 128 is compressed. Then, as shown in FIG. 5B, after the engaging portion 124 passes through the inclined surface 134, the engaging portion 124 leans against the third surface 133 and moves downward, and the first elastic member 128 may be slightly restored.

The third surface 133 of the support 130 presents a recessed surface 135 (FIG. 5B) at a position beside the engaging slot 137. Finally, as shown in FIG. 5C, the engaging portion 124 enters the engaging slot 137. At this moment, the first elastic member 128 may be restored more. However, since a length of the first elastic member 128 is still greater than an initial length of the first elastic member 128, the first elastic member 128 continuously pulls the engaging portion 124 to move in a direction close to the first surface 111 to lean against the recessed surface 135. The engaging portion 124 stays on the recessed surface 135 of the support 130 without being easily moved upward, so as to complete assembling.

Conversely, when the user wants to remove the hard disk bracket 110 from the support 130, the user may press the button 126 of the retractable engaging member 120 to make the engaging portion 124 of the retractable engaging member 120 floating on the engaging slot 137 without leaning against the recessed surface 135 of the support 130, and then the hard disk bracket 110 may be pulled up to make the retractable engaging member 120 to leave the support 130 along the assembling channel 136 to complete disassembling. In this way, the hard disk bracket 110 of the embodiment may be quickly disassembled from and assembled to the engaging slot 137 of the support 130 through the retractable engaging member 120.

Moreover, as shown in FIG. 3B, in the embodiment, the main casing 20 further includes a first partition plate 26 located between the two lateral plates 24 and standing on an edge of the bottom plate 22. In the embodiment, the first partition plate 26 partitions the two expansion cards 38. The first partition plate 26 has a first hole 27. The hard disk bracket 110 further includes a first extending portion 115 extending downward, and the first extending portion 115 has a second hole 116. The server chassis 10 further includes a bolt 150, and when the hard disk bracket 110 is disposed on the support 130, the second hole 116 is aligned with the first hole 27, and the bolt 150 penetrates through the second hole 116 and the first hole 27 to make the hard disk bracket 110 to be more stably located in the main casing 20 and less likely move up due to factors such as vibration, etc.

Moreover, in the embodiment, the main casing 20 further includes a second partition plate 28 located between the two lateral plates 24 and standing on an edge of the bottom plate 22, and in the embodiment, one of the expansion cards 38 is located between the first partition plate 26 and the second partition plate 28. The second partition plate 28 has a screw hole 29. The hard disk bracket 110 includes a second extending portion 117 extending downward, and the second extending portion 117 has a third hole 118. The server chassis 10 further includes a screw 152, and when the hard disk bracket 110 is disposed on the support 130, the third hole 118 is aligned with the screw hole 29, and the screw 152 penetrates through the third hole 118 and is fixed to the screw hole 29. In the embodiment, the screw 152 is, for example, a hand screw 152, and the user may fix it by rotating it by hand without using additional tools, which may effectively improve stability of the hard disk bracket 110.

Certainly, in other embodiments, a relative position of the hard disk bracket 110 and the main casing 20 of the server chassis 10 may also be fixed by using a single screw 152, multiple screws 152, a single bolt 150, or multiple bolts 150.

Moreover, referring back to FIG. 4, in the embodiment, the support 130 has a position limiting groove 138 recessed from the edge, and the hard disk bracket 110 includes a positioning bolt 112 protruding from the first surface 111. Each positioning bolt 112 includes a neck portion 113 connected to the first surface 111 and an expansion portion 114 connected to the neck portion 113, where a width of the neck portion 113 is smaller than a width of the position limiting groove 138, and a width of the expansion portion 114 is greater than the width of the position limiting groove 138. Therefore, the neck portion 113 of the positioning bolt 112 is adapted to enter the position limiting groove 138 of the support 130. Two wall surfaces of the support 130 beside the position limiting groove 138 may be used to stop the neck portion 113 of the positioning bolt 112 from moving laterally (for example, upper left and lower right directions in FIG. 4). The expansion portion 114 may be used to prevent the hard disk bracket 110 from coming out in an extending direction of the neck portion 113 (lower left and upper right directions in FIG. 4).

Therefore, the hard disk bracket 110 of the embodiment may be stably fixed to the main casing 20 and the support 130 through the above structure.

It should be noted that in the embodiment, the server chassis 10 is a 2U chassis, the hard disk bracket 110 is disposed on an upper layer, and the hard disk bracket 110 and the bottom plate 22 of the main casing 20 are spaced apart by a height of 1 U (1.75 inches). Therefore, other electronic components may be placed between the hard disk bracket 110 and the bottom plate 22 of the main casing 20. Certainly, in other embodiments, the server chassis 10 may also be chassis of other heights, for example, a height of 4 U, but the invention is not limited thereto. A distance between the two supports 130 and the bottom plate 22 of the main casing 20 is, for example, greater than or equal to 1 U (1.75 inches), but the invention is not limited thereto.

In the embodiment, in order to facilitate the user to conveniently maintain the electronic components at the bottom of the hard disk bracket 110, when the hard disk bracket 110 is disposed on the support 130, the hard disk bracket 110 may be pivotally connected to the support 130 by taking the retractable engaging member 120 as an axis, so as to expose the electronic components at the bottom of the hard disk bracket 110.

Figure 6A:
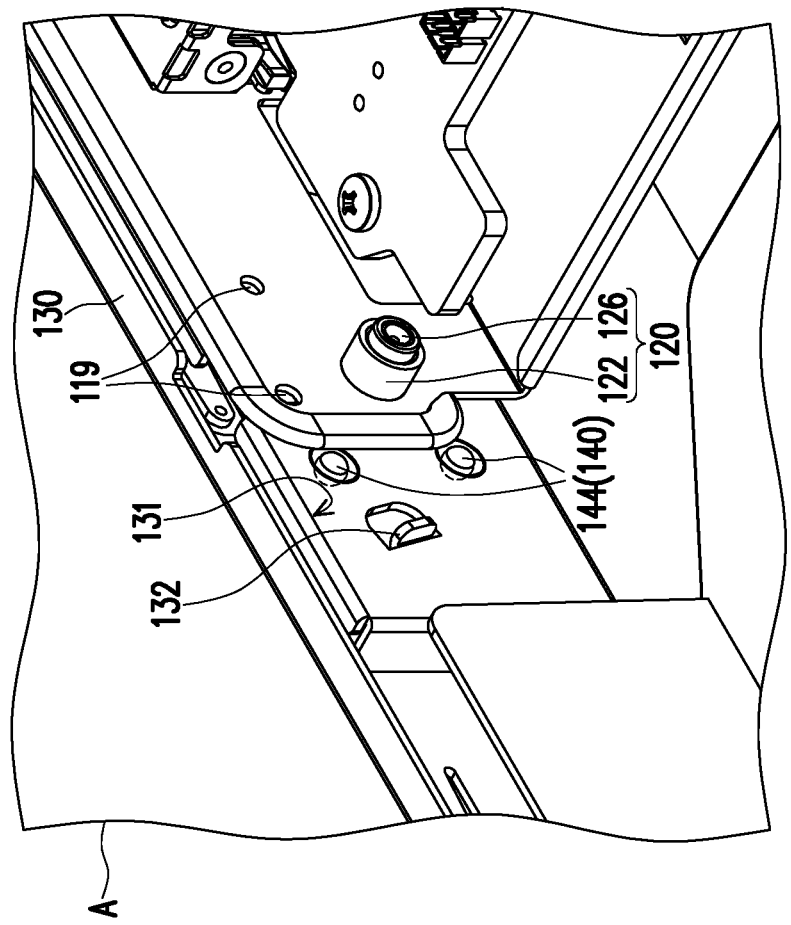
FIG. 6A to FIG. 6C are partial schematic diagrams of a process that the hard disk bracket of FIG. 4 is rotated relative to the supports.
Figure 6B:
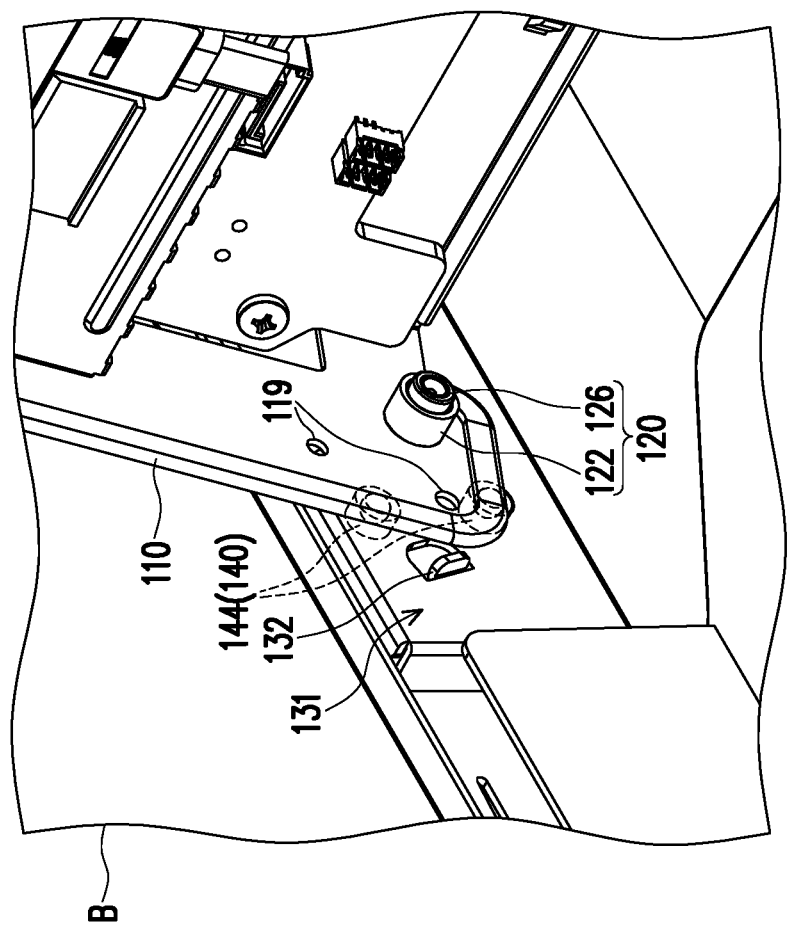
Figure 6C:
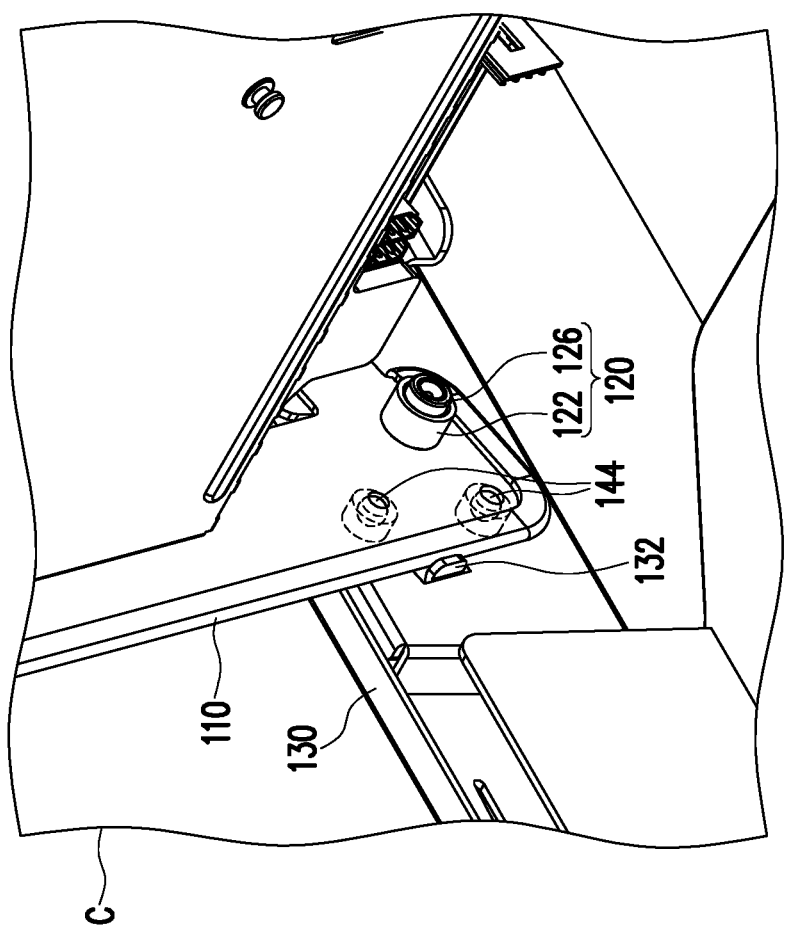

FIG. 6A to FIG. 6C are partial schematic diagrams of a process that the hard disk bracket of FIG. 4 is rotated relative to the supports, where FIG. 6A to FIG. 6C are enlarged views of regions A, B, C in FIG. 1A, FIG. 2A and FIG. 2B. Referring to FIG. 6A to FIG. 6C, in the embodiment, the support 130 includes a stop member 132 located beside the assembling channel 136 (FIG. 4) and protruding from the second surface 131 of the support 130. In the embodiment, the stop member 132 is formed by bending a part of the support 130, but the invention is not limited thereto.

The hard disk bracket 110 may be rotated relative to the support 130 as that shown in FIG. 6A to FIG. 6C until the hard disk bracket 110 contacts the stop member 132. In other words, when the hard disk bracket 110 contacts the stop member 132, it is the end of the rotation of the hard disk bracket 110. In the embodiment, the hard disk bracket 110 may be rotated relative to the support 130 by about 105 degrees, but the angle is not limited thereto.

Since the above angle is greater than 90 degrees, a center of gravity of the hard disk bracket 110 may be moved from one side (for example, the side of the hard disk bracket 110 in FIG. 1A) of a rotating shaft (the retractable engaging member 120) to the other side (for example, the side of the second hard disk region 32 in FIG. 1A). In this way, when the hard disk bracket 110 is flipped relative to the support 130 to the position shown in FIG. 6C, the hard disk bracket 110 is not easy to flip back by itself, and the user does not need to hold the hard disk bracket 110 by hand, which is more convenient in operation.

It should be noted that in order to provide a torque when the hard disk bracket 110 is rotated relative to the support 130, in the embodiment, one of the hard disk bracket 110 and the support 130 includes a protruding assembly. During rotation of the hard disk bracket 110 relative to the support 130, the protruding assembly is adapted to push against the hard disk bracket 110 or the support 130 with a recessed assembly. The other one of the hard disk bracket 110 and the support 130 includes the recessed assembly corresponding to the protruding assembly, and the recessed assembly is located at an end point of a movement trajectory of the protruding assembly, and when the hard disk bracket 110 is rotated to the end point, the protruding assembly is aligned with the recessed assembly.

To be more specific, referring to FIG. 6A, in the embodiment, the recessed assembly includes a plurality of positioning recess holes 119 located on the hard disk bracket 110. The protruding assembly is located on the support 130, and includes a plurality of protrusions 140 protruding from the second surface 131. In the embodiment, an amount of the protrusions 140 is, for example, two, but the invention is not limited thereto. As shown in FIG. 4, the protrusions 140 are located beside the assembling channel 136 along an extending direction of the assembling channel 136.

As shown in FIG. 6A, when the hard disk bracket 110 is located at an initial position relative to the support 130, the protrusions 140 are located beside the edge of the hard disk bracket 110 without contacting the hard disk bracket 110. During rotation of the hard disk bracket 110 relative to the support 130 (FIG. 6A to FIG. 6B), one of the protrusions 140 (for example, an upper protrusion 140 in FIG. 6) may first contact the first surface 111 of the hard disk bracket 110 to provide friction. As shown in FIG. 6B, after the hard disk bracket 110 is rotated relative to the support 130 by a specific angle (for example, an angel greater than 70 degrees), the protrusions 140 together contact the first surface 111 of the hard disk bracket 110 to provide more friction.

Certainly, in other embodiments, the protruding assembly may also include only a single protrusion 140 protruding from the second surface 131, and the recessed assembly may also include only a single positioning recess hole 119 corresponding to the protrusion 140. The amount of the protrusions 140 of the protruding assembly and the amount of the positioning recess holes 110 of the recessed assembly, and the forms of the protruding assembly and the recessed assembly are not limited to the above description.

Then, as shown in FIG. 6C, when the hard disk bracket 110 is rotated to contact the stop member 132, the protrusions 140 may fall into the positioning recess holes 119. A wall surface of the hard disk bracket 110 beside the positioning recess holes 119 may be used as a position limiting surface of the protrusions 140, which helps the hard disk bracket 110 to stably stay at the position after flipping.

Figure 7A:
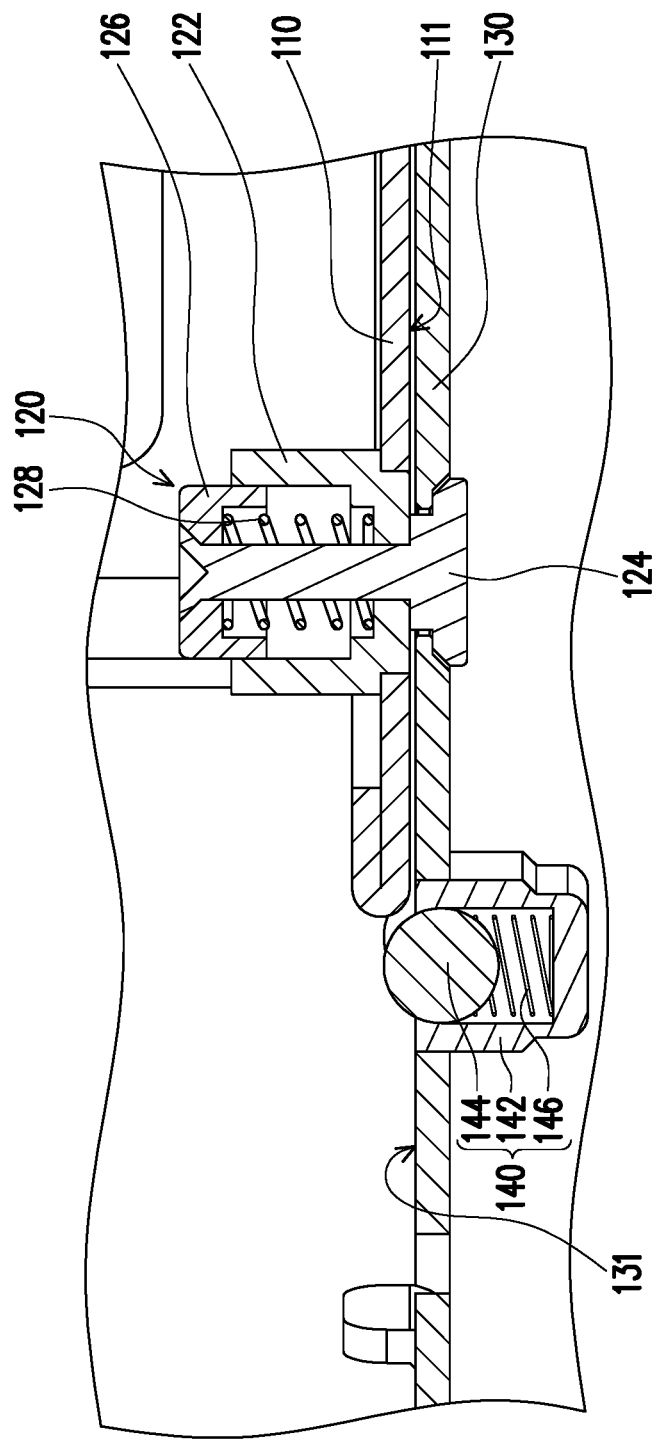
FIG. 7A to FIG. 7C are partial cross-sectional views of a position relationship between protrusions and the hard disk bracket when the hard disk bracket of FIG. 4 is rotated relative to the supports.
Figure 7B:
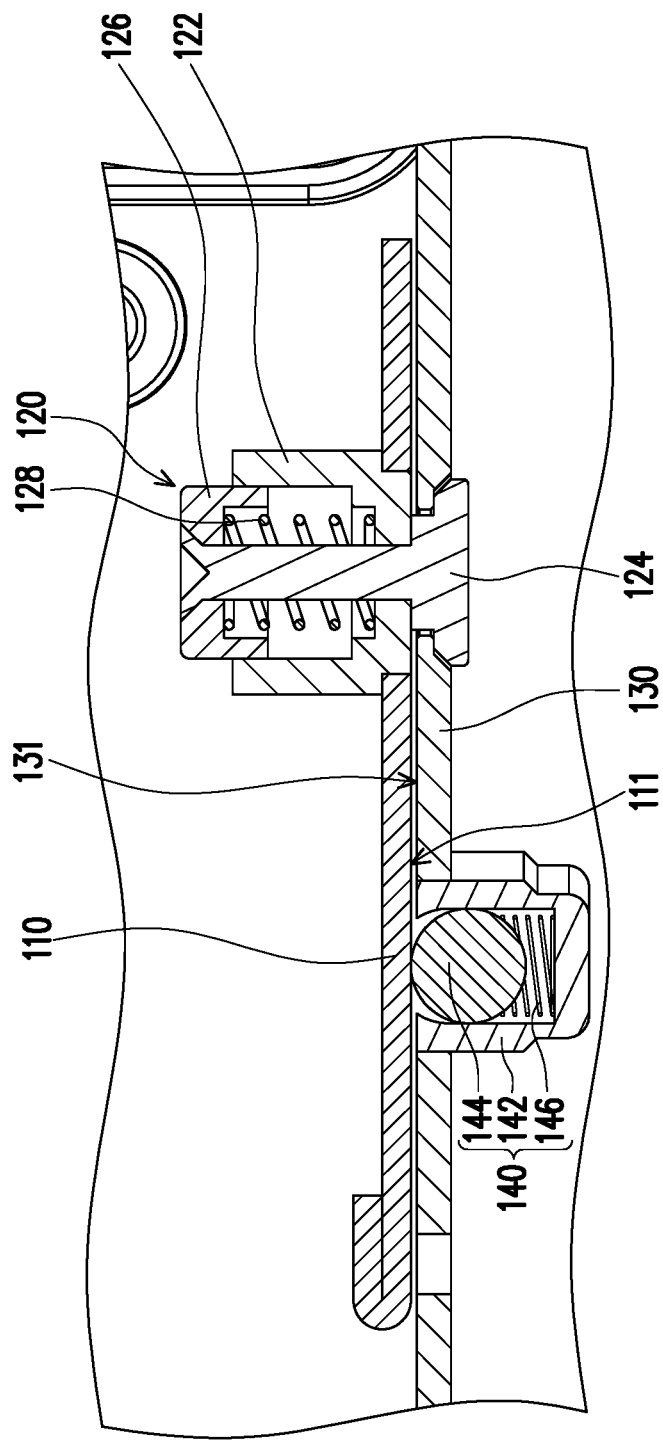
Figure 7C:
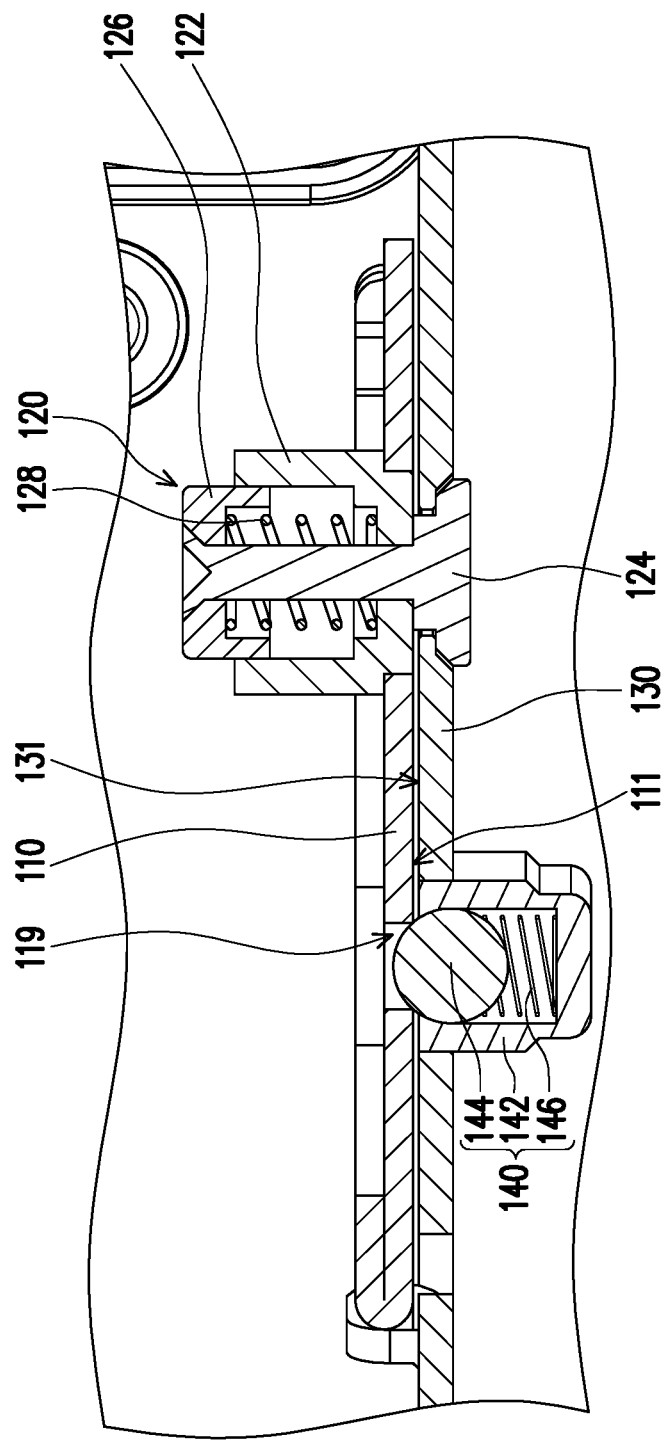

FIG. 7A to FIG. 7C are partial cross-sectional views of a position relationship between the protrusions and the hard disk bracket when the hard disk bracket of FIG. 4 is rotated relative to the supports. Referring to FIG. 7A, in the embodiment, the protrusion 140 includes a second base 142 disposed on the support 130 and a bead 144 disposed on the second base 142, and the bead 144 is protruded from the second surface 131. In the embodiment, the protrusion 140 may further selectively include a second elastic member 146 located in the second base 142 and linked to the bead 144. The second elastic member 146 is, for example, a spring, but may also be an elastic piece, a compressed foam, etc., which is not limited by the invention.

As shown in FIG. 7B, when the bead 144 is pushed and squeezed, the second elastic member 146 may be compressed to make the bead 144 to retract into the second base 142, but the bead 144 may still be in contact with the first surface 111 of the hard disk bracket 110. As shown in FIG. 7C, when the hard disk bracket 110 is rotated to the end, the bead 144 falls into the positioning recess hole 119. A designer may control an elastic coefficient of the second elastic member 146 to adjust a degree of retraction of the bead 144 retracted into the second base 142 when the bead 114 is pushed and squeezed, so as to provide different magnitudes of torque.

In an embodiment, the second elastic member 146 may also be omitted, a depth of the second base 142 may be smaller, so that a small part of the bead 144 is kept on protruding from the second surface 131 of the support 130. In this way, during rotation of the hard disk bracket 110 relative to the support 130, the bead 144 may provide greater friction to the first surface 111 of the hard disk bracket 110. In the embodiment, the designer may provide different magnitudes of torque by controlling a degree of protrusion of the bead 144 on the second surface 131 of the support 130 or a contact area with the first surface 111. Certainly, the form of the protrusions is not limited thereto.

Figure 8:
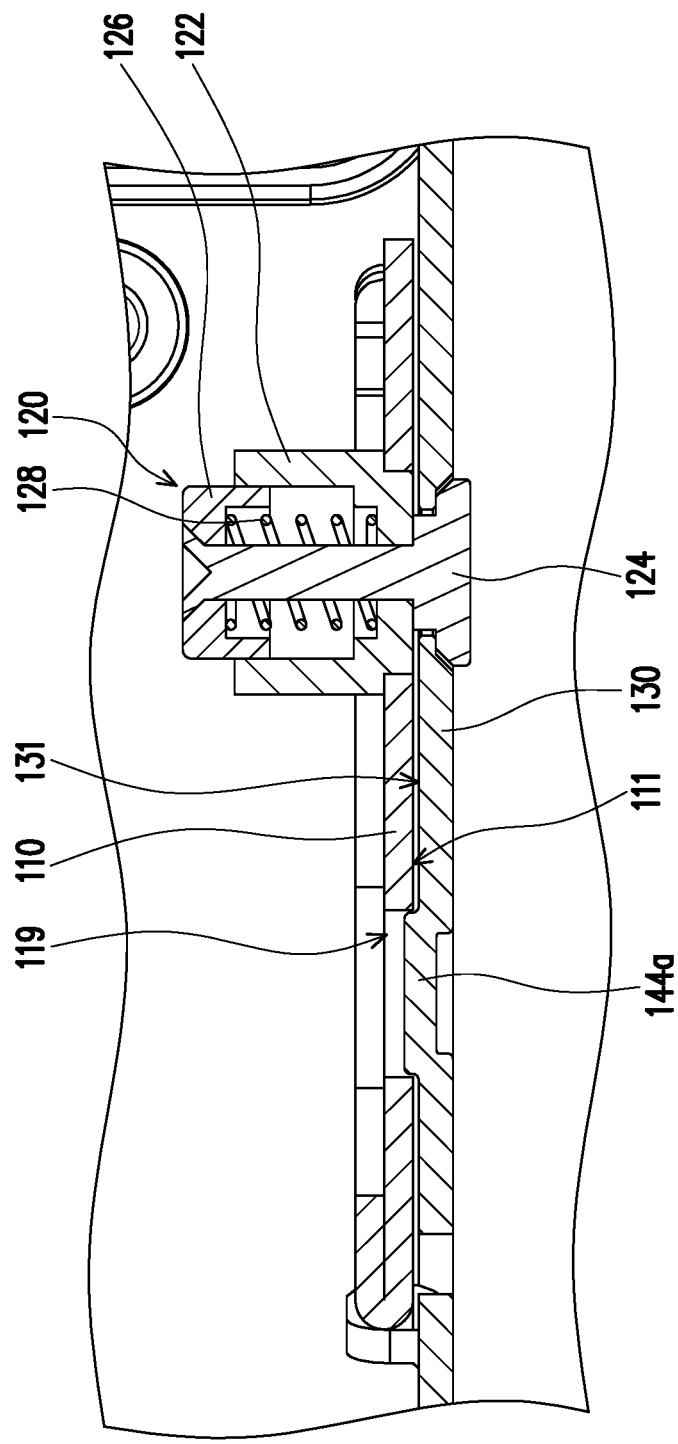
FIG. 8 is a cross-sectional schematic view of a protrusion according to an embodiment of the invention.

FIG. 8 is a cross-sectional schematic view of a protrusion according to an embodiment of the invention. Referring to FIG. 8, in the embodiment, the protrusion may also be an embossing portion 144a of the support 130. Namely, the embossing portion 144a is formed by embossing a part of the support 130. Similarly, the embossing portion 144a may also provide friction to the first surface 111 of the hard disk bracket 110 during the rotation process of the hard disk bracket 110, and is positioned in the positioning recess hole 119 when the hard disk bracket 110 is rotated to the end. In the embodiment, the designer may control to provide different magnitudes of torque by controlling a degree of protrusion of the embossing portion 144a on the second surface 131 of the support 130 or a contact area of the embossing portion 144a and the first surface 111.

It should be noted that in the embodiment, the hard disk bracket 110 cooperates with the engaging slot 137 on the support 130 through the retractable engaging member 120, so as to achieve an effect of quick disassembling and assembling. In other embodiments, the retractable engaging member 120 and the engaging slot 137 may also be applied to other two objects to achieve the effect of quick disassembling and assembling the two objects, and an application field thereof is not limited to the server chassis 10.

In an embodiment, the quick release device may also include a first quick release structure and a second quick release structure. The first quick release structure includes, for example, a first casing and the retractable engaging member 120 penetrating through the first casing, and the second quick release structure is, for example, a second casing including the assembling channel 136 and the engaging slot 137. In an embodiment, the first casing is, for example, the hard disk bracket 110. The second casing is, for example, the support 130. In another embodiment, the first casing is, for example, a tablet computer, and the second casing is, for example, an input module having a keyboard, etc. Certainly, the types of the first casing and the second casing are not limited thereto.

It should be noted that since the retractable engaging member 120 may be used as a pivot to make the first casing to be rotated relative to the second casing, the first casing may also be an upper casing of a notebook computer, and the second casing may also be a lower casing of the notebook computer. Moreover, one of the first quick release structure and the second quick release structure may further include a protruding assembly (for example, the protrusion 140), for example, the protrusion 140 is located on the second casing and faces the first casing, during rotation of the first casing relative to the second casing, the protrusion 140 may push against the first casing, such that the friction between the protrusion 140 and the first casing may be taken as a torque during the rotation process. In other words, cooperation of the retractable engaging member 120 and the protrusion 140 may achieve a hinge function, and compared with a conventional hinge structure, the cooperation of the retractable engaging member 120 and the protrusion 140 of the embodiment may provide friction as the torque through a quite simple structure, which also achieves a small volume and saves cost.

Moreover, one of the first quick release structure and the second quick release structure may further include a recessed assembly (for example, a positioning recess hole 119), and when the first casing is rotated relative to the second casing to the end, the protrusion 140 enters the positioning recess hole 119 to provide a fixing effect. Therefore, an application field of the quick release devices is not limited by the drawings.

In summary, the retractable engaging member is disposed on the hard disk bracket of the server chassis of the invention. When a user wants to assemble the hard disk bracket to the support, as long as the engaging portion of the retractable engaging member is put into the engaging slot along the edge of the assembling channel of the support, the engaging portion is pulled by the first elastic member to lean against the engaging slot to complete the assembly. When the user wants to remove the hard disk bracket from the support, the user may press the button of the retractable engaging member, so that the engaging portion of the retractable engaging member does not lean against the engaging slot of the support, and then the hard disk bracket may be pulled up to make the retractable engaging member leave the support along the assembling channel, so as to complete the disassembly.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A server chassis, comprising:
a main casing, comprising a lateral plate;
a support, fixed to the lateral plate, and having an assembling channel recessed from an edge and an engaging slot located at an end of the assembling channel;
a hard disk bracket, detachably disposed on the support, and having a first surface facing the support; and
a retractable engaging member, penetrating through the hard disk bracket, and comprising a first base, an engaging portion movably penetrating through the first base, a button linked to the engaging portion and a first elastic member located between the button and the engaging portion, wherein the button and the engaging portion are protruded from two opposite ends of the first base, the engaging portion is retractably protruded from the first surface of the hard disk bracket, and the engaging portion of the retractable engaging member is adapted to move in or out of the engaging slot along an edge of the assembling channel of the support.

2. The server chassis as claimed in claim 1, wherein when the hard disk bracket is disposed on the support, the hard disk bracket is pivotally connected to the support by taking the retractable engaging member as an axis.

3. The server chassis as claimed in claim 2, wherein one of the hard disk bracket and the support comprises a protruding assembly, and the other one comprises a recessed assembly corresponding to the protruding assembly, the recessed assembly is located at an end point of a movement trajectory of the protruding assembly, and during rotation of the hard disk bracket relative to the support, the protruding assembly is adapted to push against the hard disk bracket or the support having the recessed assembly until the protruding assembly is aligned with the recessed assembly.

4. The server chassis as claimed in claim 3, wherein the recessed assembly is located on the hard disk bracket, the support has a second surface facing the first surface, and the protruding assembly is located on the support and is protruded from the second surface, the protruding assembly comprises a plurality of protrusions protruding from the second surface, and the recessed assembly comprises a plurality of positioning recess holes located on the hard disk bracket, wherein when the hard disk bracket is located at an initial position relative to the support, the protrusions are located beside an edge of the hard disk bracket without contacting the hard disk bracket, during rotation of the hard disk bracket relative to the support, one of the protrusions first contacts the first surface of the hard disk bracket, and after the hard disk bracket is rotated relative to the support by a specific angle, the protrusions together contact the first surface of the hard disk bracket.

5. The server chassis as claimed in claim 4, wherein each of the protrusions comprises a second base disposed on the support and a bead disposed on the second base, and the bead is protruded from the second surface.

6. The server chassis as claimed in claim 4, wherein each of the protrusions comprises an embossing portion of the support.

7. The server chassis as claimed in claim 2, wherein the support comprises a stop member located beside the assembling channel, and the hard disk bracket is rotated relative to the support until the hard disk bracket contacts the stop member.

8. The server chassis as claimed in claim 1, wherein the main casing comprises a bottom plate connected to the lateral plate and a first partition plate standing on an edge of the bottom plate, the first partition plate has a first hole, the hard disk bracket comprises a first extending portion extending downward, and the first extending portion has a second hole, wherein when the hard disk bracket is disposed on the support, the second hole is aligned with the first hole, wherein the server chassis further comprises a bolt penetrating through the second hole and the first hole.

9. The server chassis as claimed in claim 1, wherein the main casing comprises a bottom plate connected to the lateral plate and a second partition plate standing on an edge of the bottom plate, the second partition plate has a screw hole, the hard disk bracket comprises a second extending portion extending downward, and the second extending portion has a third hole, wherein when the hard disk bracket is disposed on the support, the third hole is aligned with the screw hole, wherein the server chassis further comprises a screw penetrating through the third hole and fixed to the screw hole.

10. The server chassis as claimed in claim 1, wherein the support has a position limiting groove recessed from an edge, the hard disk bracket comprises a positioning bolt protruding from the first surface, and the positioning bolt comprises a neck portion connected to the first surface and an expansion portion connected to the neck portion, wherein the neck portion is adapted to enter the position limiting groove of the support, and a width of the expansion portion is larger than a width of the position limiting groove.

* * * * *